(12) United States Patent
Lo (10) Patent No.: US 8,345,417 B2
(45) Date of Patent: Jan. 1, 2013

(54) EXTENSION POSITIONING STRUCTURE FOR A PORTABLE MEMORY DEVICE

(76) Inventor: Yu-Nan Lo, Taichung (TW)

( * ) Notice: Subject to any disclaimer, the term of this patent is extended or adjusted under 35 U.S.C. 154(b) by 124 days.

(21) Appl. No.: 13/090,998

(22) Filed: Apr. 20, 2011

(65) Prior Publication Data
US 2012/0268883 A1 Oct. 25, 2012

(51) Int. Cl.
*H05K 5/00* (2006.01)
*H05K 7/00* (2006.01)
(52) U.S. Cl. ............... 361/679.31; 361/752; 439/131
(58) Field of Classification Search ............ 361/679.31, 361/752; 439/131
See application file for complete search history.

(56) References Cited

U.S. PATENT DOCUMENTS

| | | | |
|---|---|---|---|
| 6,567,273 B1* | 5/2003 | Liu et al. | 361/737 |
| 6,979,210 B2* | 12/2005 | Regen et al. | 439/131 |
| 7,004,780 B1* | 2/2006 | Wang | 439/353 |
| 7,125,265 B2* | 10/2006 | Weng | 439/131 |
| 7,787,243 B2* | 8/2010 | Salazar et al. | 361/679.31 |
| 7,796,379 B2* | 9/2010 | Tsai | 361/679.32 |

* cited by examiner

*Primary Examiner* — Anthony Haughton (57) ABSTRACT

An extension positioning structure for a portable memory device comprises a main body in a shell. A first end of the main body is disposed a drive element, and a spring is mounted outside a second end of the main body. A positioning element is pivotally disposed between the shell and the drive element. The positioning element includes a pivot shaft and an engaging portion. The engaging portion is helically formed with multiple cutting surfaces, and the positioning block is formed with a positioning block and a limiting block. By pushing the drive element, the cutting surface of the engaging portion of the positioning element cooperates with the positioning block and the limiting block to make the connecting terminal extend out of and retract into the shell, facilitating the operation and storage of the memory device while reducing both the production cost and increasing the yield rate.

8 Claims, 11 Drawing Sheets

EXTENSION POSITIONING STRUCTURE FOR A PORTABLE MEMORY DEVICE

BACKGROUND OF THE INVENTION

1. Field of the Invention

The present invention relates to a memory device, and more particularly to an extension positioning structure for a portable memory device.

2. Description of the Prior Art

Memory devices which are generally referred to as traveling disks become more and more popular due to large storage capacity and small volume. A common traveling disk normally comprises a memory unit with a connecting terminal and a shell for protecting the memory unit. The connecting terminal of many of the current traveling disks is extensible or retractable with respect to the shell.

Conventionally, the connecting terminal of the traveling disk is linearly pushed to slide in the shell to perform the extending and retracting operation. Since there is no buffer structure in the traveling disk, the linear pushing force applied to the connecting terminal will cause wear of the push rod or the cooperating rail, consequently resulting in loss of the extending and retracting function of the connecting terminal and causing damage to the internal structure.

In addition, some of the conventional traveling disks don't have any positioning structure to keep the connecting terminal in the extended and retracted positions, and for these conventional traveling disks without positioning structures, when inserting the connecting terminal into the transmission port, the user has to apply force to the push rod in order to prevent the connecting terminal from retracting in the shell. To solve the above problem, the traveling disk is formed with a positioning structure on an inner surface thereof by injection molding. However, such a positioning structure which employs a concave structure cooperating with a convex structure to fix the connecting terminal to the shell won't have a good positioning effect since the shell is made of plastic and deformable.

Two conventional memory devices are provided herein for reference. As for a first conventional memory device, since the traveling disk has a small volume and a much smaller internal structure, when the user applies an improper force, a damage beyond repair will be caused to the internal structure. Therefore, a second conventional memory device disclosed an extending and retracting traveling structure which consists of many elements, it is a complicated structure and inconvenient to assemble. In addition, its complicated structure will further cause a relatively low yield rate.

The present invention has arisen to mitigate and/or obviate the afore-described disadvantages.

SUMMARY OF THE INVENTION

The primary objective of the present invention is to provide an extension positioning structure for a portable memory device which makes it convenience for the user to operate and store the memory device while reducing the production cost and increasing yield rate.

Hence, to achieve the above objective, an extension positioning structure for a portable memory device in accordance with the present invention comprises a main body disposed in a shell combined by two covers. A first end of the main body is disposed in a drive element, and a spring is mounted outside a second end of the main body. A positioning element is pivotally disposed between the drive element and one of the covers.

The drive element is formed with an accommodation space for accommodation of the memory unit of the main body, the accommodation space is formed with a closed end and an open end, the accommodation space is provided with a pushing portion protruding at a first one of two opposite sides in the direction adjacent to the closed end, the accommodation space is further formed with a U-shaped groove penetrating a bottom surface thereof at a second one of the two opposite sides thereof, an elastic portion is formed on the bottom surface of the accommodation space and surrounded by the U-shaped groove, the elastic portion is formed with a recess from an exterior of the drive element toward an interior of the accommodation space.

The positioning element is pivotally disposed in the recess of the drive element, the positioning element includes a pivot shaft and an engaging portion protruding from one side of the pivot shaft, the engaging portion is in the form of an irregular block having multiple oblique cutting surfaces, the positioning element is pivotally disposed in the recess of the drive element such that the engaging portion protrudes toward an opening of the recess.

The shell is a hollow structure formed by oppositely combining a first cover and a second cover for accommodation of the main body, each of the first and the second covers is formed with a closed end and an open end, the shell is formed with a slot after the first cover and the second cover are combined, so that the pushing portion of the drive element can extend out of the shell. The shell is further formed with an opening for extension of the connecting terminal. The second cover is further formed with a positioning block adjacent to the closed end and a limiting block adjacent to the open end.

Thereby, the spring has two ends pushed against an edge of the open end of the drive element and a peripheral edge of the opening of the shell, respectively, the drive element drives the main body and the positioning element to slide in the shell, when the drive element compresses the spring and makes the connecting terminal extend out of the shell, the positioning block of the shell will be engaged in the gap of the positioning element, when the spring pushes against the drive element and makes the connecting terminal retract into the shell, the positioning block of the shell will disengage from the engaging portion of the positioning block.

In addition, since the present invention provides an extension structure for a portable memory device which utilizes the drive element to drive the positioning element and the positioning block and the limiting block which are integrally formed on the second cover to control the connecting terminal to extend out and retract into the shell. By such arrangements, the present invention has the advantages of simplified elements, reduced production cost, enhanced cooperation stability of the respective elements and increased yield rate. Furthermore, it is more convenient for the user to operate or store the memory device.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
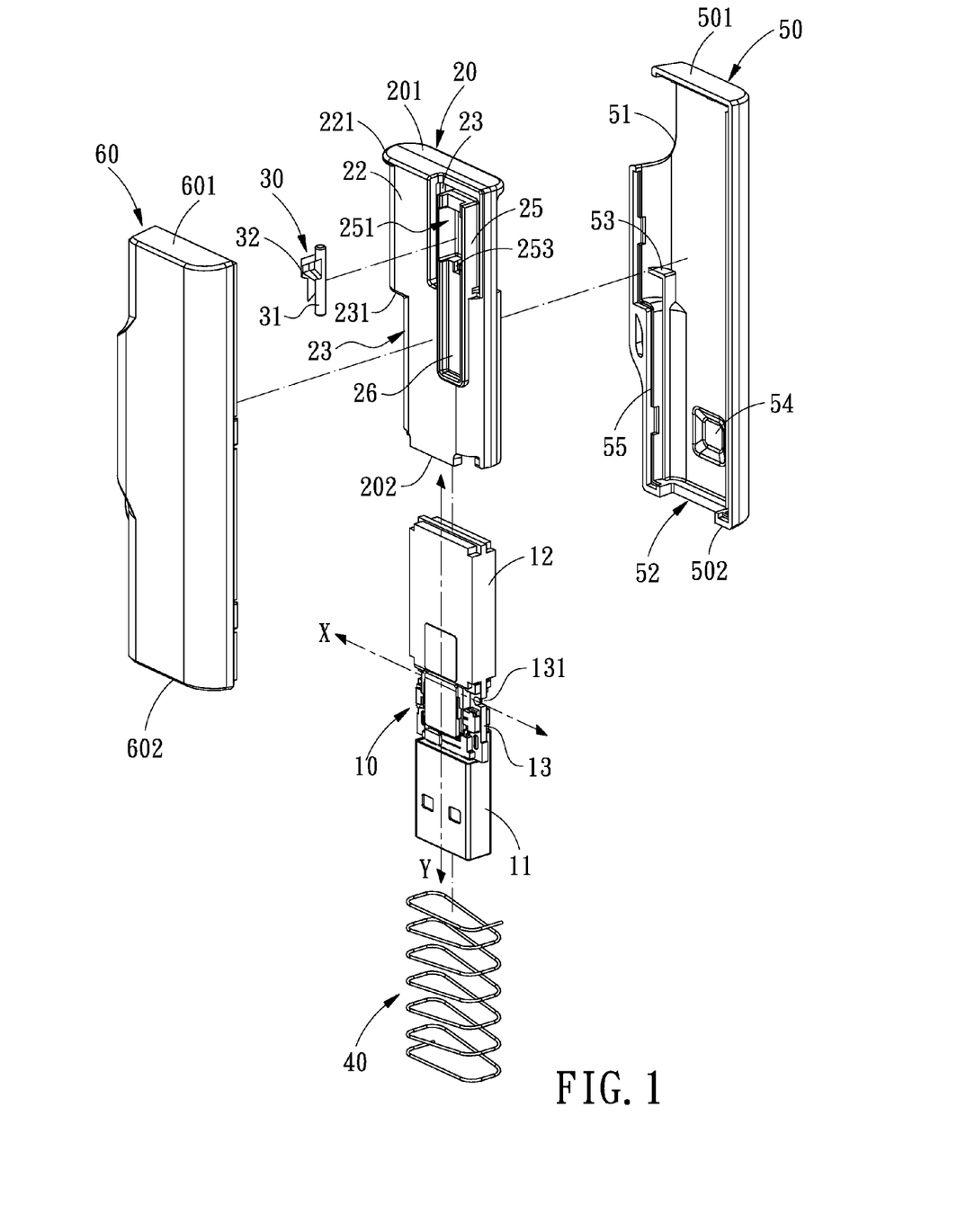
FIG. 1 is an exploded view of an extension positioning structure for a portable memory device in accordance with the present invention.

Firstly, referring to FIG. 1 together with FIGS. 2A-3B, an extension positioning structure for a portable memory device in accordance with a preferred embodiment of the present invention comprises a main body 10, a drive element 20, a positioning element 30, and a spring 40 that are assembled in a shell A formed by a first cover 50 and a second cover 60.

The main body 10 is rectangular in cross section and includes a connecting terminal 11, a memory unit 12 and a connecting portion 13 connecting the connecting terminal 11 and the memory unit 12. An extending direction of the connecting terminal 11 and the memory unit 12 is defined as a direction Y. A notch 131 is formed in each of two Y directional sides of the connecting portion 13 and opens toward a direction X.

Figure 2A:
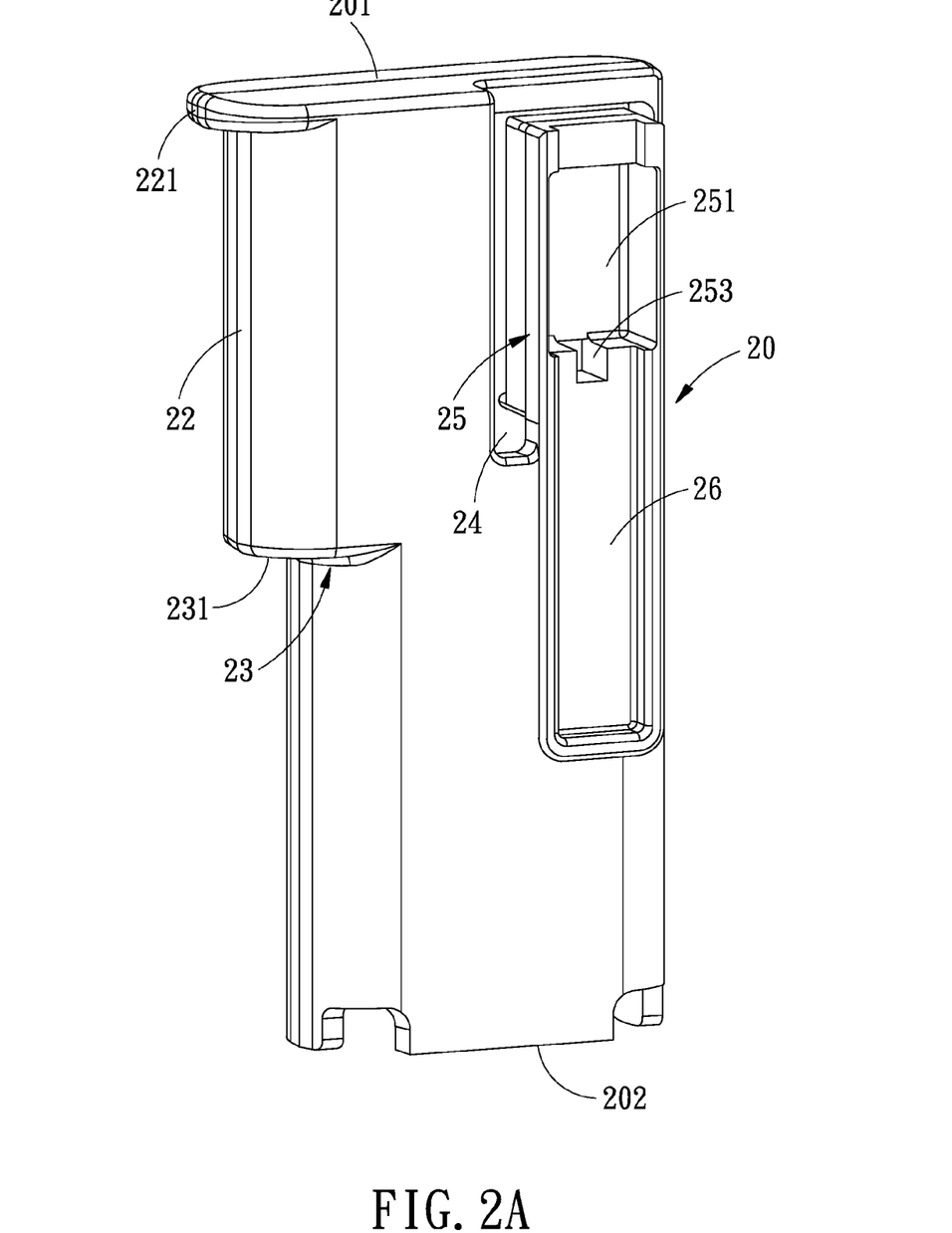
FIG. 2A is an enlarged view of one side of the drive element in accordance with the present invention.
Figure 2B:
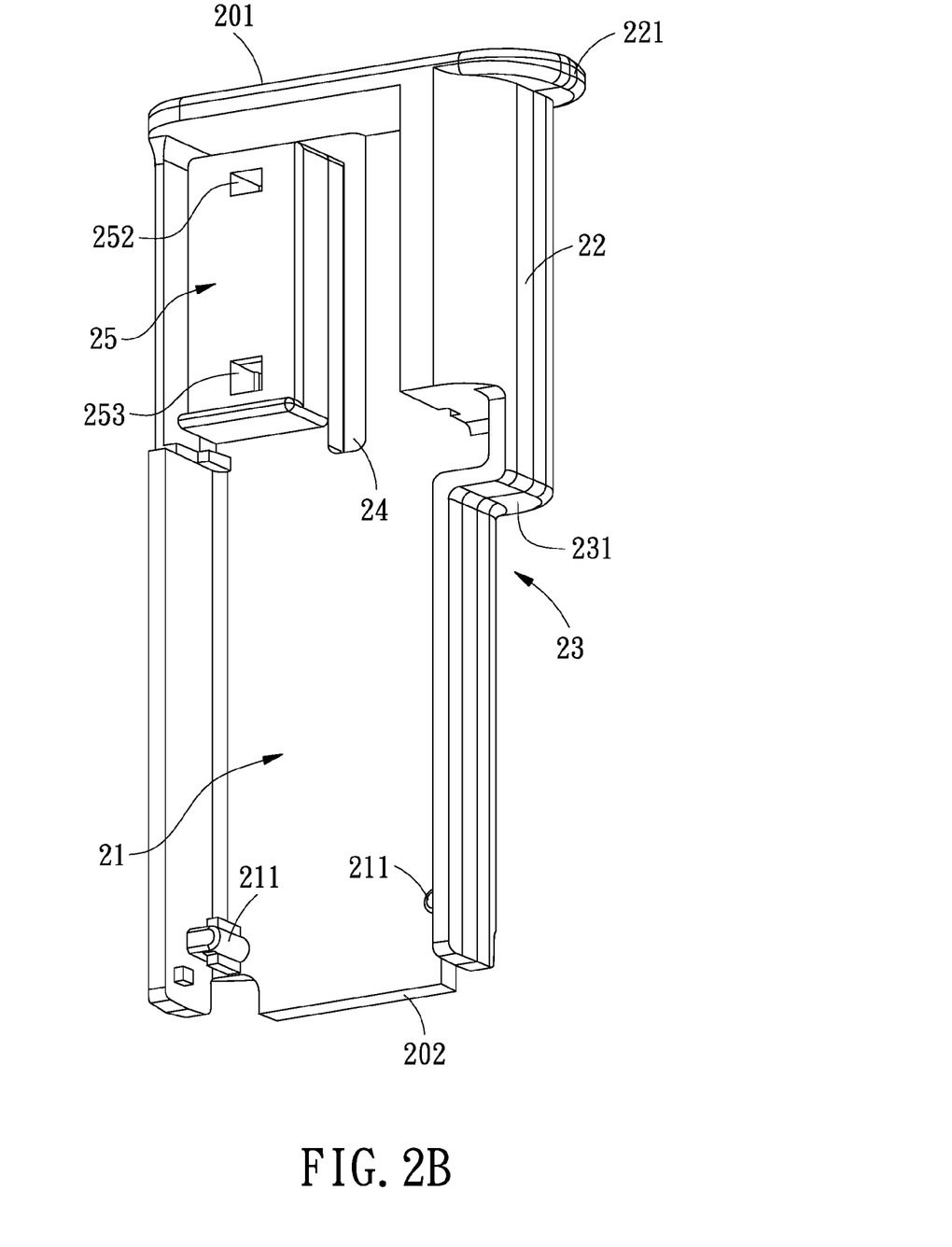
FIG. 2B is an enlarged view of another side of the drive element in accordance with the present invention.

The drive element 20 is a U-shaped groove formed with an accommodation space 21 for accommodation of the memory unit 12 of the main body 10. As shown in FIGS. 2A and 2B, the accommodation space 21 is formed with a closed end 201 and an open end 202 in the direction Y. At each of two Y directional inner sides of the accommodation space 21 is formed a positioning cylinder 211 which protrudes towards the direction X and is located adjacent to the open end 202, so that when the memory unit 12 of the main body 10 is accommodated in the accommodation space 21, the two positioning cylinders 211 can be inserted in the respective notches 131, thus positioning the drive element 20 with respect to the main body 10.

At a first Y directional side of the accommodation space 21 is provided a pushing portion 22 which protrudes outwards in the direction X and is located adjacent to the closed end 201. At a connecting portion of the closed end 201 and the pushing portion 22 is formed a resisting flange 221 which protrudes in the direction X. The drive element 20 is further formed adjacent to the open end of the accommodation space with a breach 23 and a resisting surface 231 that are in alignment with the pushing portion 22, and the resisting surface 231 separates the pushing portion 22 and the breach 23. At a second Y directional side of the accommodation space 21 is formed a U-shaped groove 24 which penetrating a bottom surface of the accommodation space 21. As shown in FIG. 2A, the U-shaped groove 24 extends along a lateral wall of the accommodation space 21 and an end wall of the closed end 201 and finally toward the open end 202 in the direction Y. On the bottom surface of the accommodation space 21 is formed an elastic portion 25 surrounded by the U-shaped groove 24 as shown in FIG. 2B. The elastic portion 25 is formed with a recess 251 from an exterior of the drive element 20 toward an interior of the accommodation space 21. In a bottom surface of the recess 251 are formed an engaging groove 252 which is located adjacent to the closed end 201 and a holding groove 253 which is located adjacent to the open end 202. An end of the recess 251 which is formed with the holding groove 253 is in communication with an elongated groove 26. The elongated groove 26 is a long shallow groove formed in the direction Y.

Figure 3A:
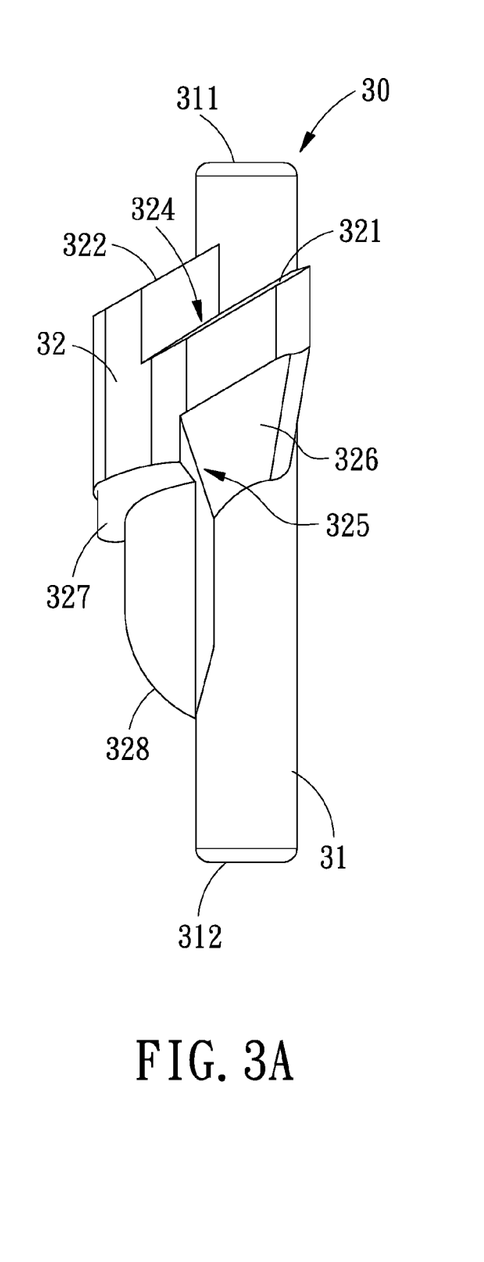
FIG. 3A is an enlarged plane view of one side of the positioning element in accordance with the present invention.
Figure 3B:
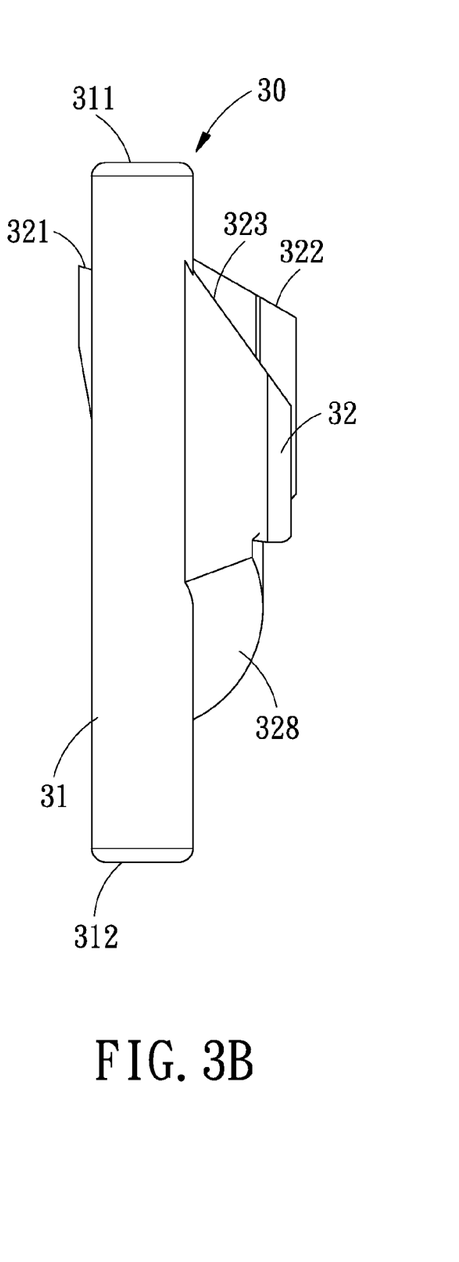
FIG. 3B is an enlarged plane view of another side of the positioning element in accordance with the present invention.

The positioning element 30 is pivotally disposed in the recess 251 of the drive element 20. The positioning element 30 includes a pivot shaft 31 and an engaging portion 32 protruding from one side of the pivot shaft 31. The pivot shaft 31 includes a first end 311 and a second end 312. The engaging portion 32 in the present embodiment is in the form of an irregular block body including multiple oblique cutting surfaces. The positioning element 30 is disposed such that the engaging portion 32 protrudes toward an opening of the recess 251, the first end 311 of the pivot shaft 31 is engaging in the engaging groove 252 of the drive element 20, and the second end 312 of the pivot shaft 32 is pivotally disposed in the holding groove 253.

Figure 7A:
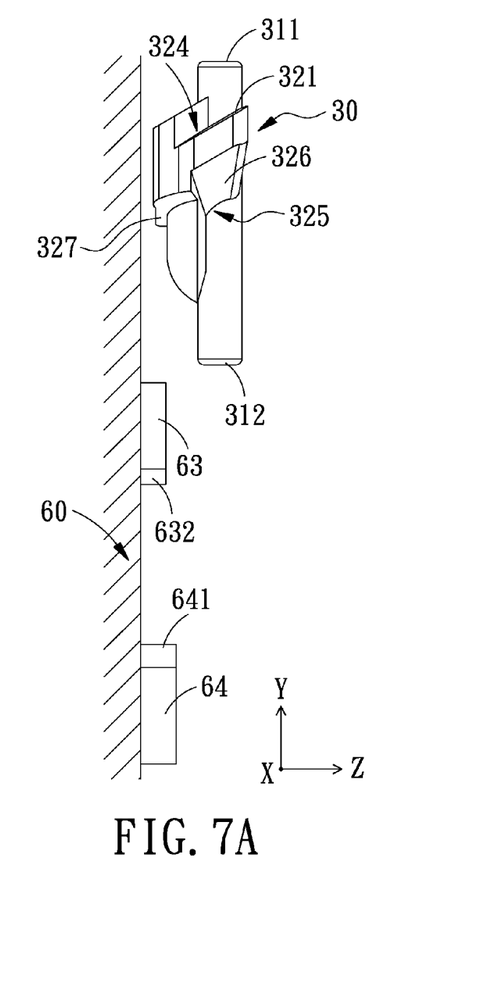
FIG. 7A is a side view showing a first structural configuration of the positioning block, the limiting block and the positioning block in the direction X.
Figure 7B:
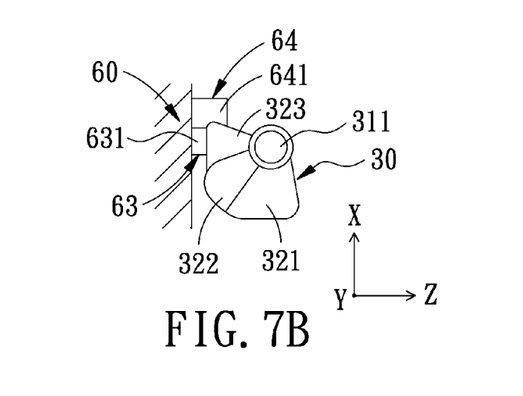
FIG. 7B is a side view showing the first structural configuration of the positioning block, the limiting block and the positioning block in the direction Y.
Figure 7C:
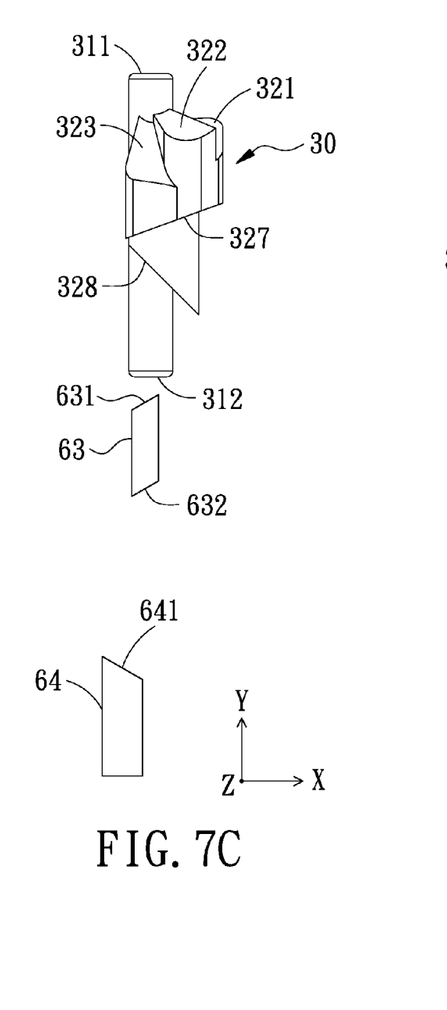
FIG. 7C is a side view showing the first structural configuration of the positioning block, the limiting block and the positioning block in the direction Z.

As shown in FIGS. 3A, 3B, 7B, and 7C, the engaging portion 32 of the positioning element 30 is cut clockwise from the first end 311 of the pivot shaft 31 toward the second end 312 of the pivot shaft 31 to form a cutting surface 321, a guiding surface 322 and an oblique surface 323 that are located adjacent to a peripheral surface of the pivot shaft 31. As shown in FIG. 7C, the guiding surface 322 is formed between the cutting surface 321 and the oblique surface 323 and located closer to the first end 311 than the cutting surface 321 and the oblique surface 323. The guiding surface 322 and the oblique surface 323 are oblique surfaces radially formed from the pivot shaft 31 toward the second end 312. The degree of inclination of the guiding surface 322 is smaller than that of the oblique surface 323. As shown in FIGS. 3A and 7B, the cutting surface 321 is helically formed from a side surface of the engaging portion 32 toward the second end 312 along the peripheral surface of the pivot shaft 31, such that a height difference is formed between the guiding surface 322 and the cutting surface 321 to form a gap 324. The engaging portion 32 is formed adjacent to the second end 312 with a notch 325 opposite the gap 324, and a pressing surface 326 opposite the cutting surface 321. The pressing surface 326 is an oblique surface formed radially from the pivot shaft 31 toward the first end 311. Under the guiding surface 322 and the oblique surface 323 is formed a clockwise guiding surface 327 which is parallel to a helical direction of the cutting surface 321 and helically formed from the notch 325. The engaging clockwise guiding surface 327 is formed with a block protruding toward the second end 312. The block of the clockwise guiding surface 327 is helically formed on a side surface thereof adjacent to the second end 312 with a counterclockwise guiding surface 328. The clockwise guiding surface 327 cooperates with the counterclockwise guiding surface 328 to form a two-stage structure.

The spring 40 is a coil spring and includes two ends. The spring 40 is mounted outside the connecting terminal 11.

Figure 4:
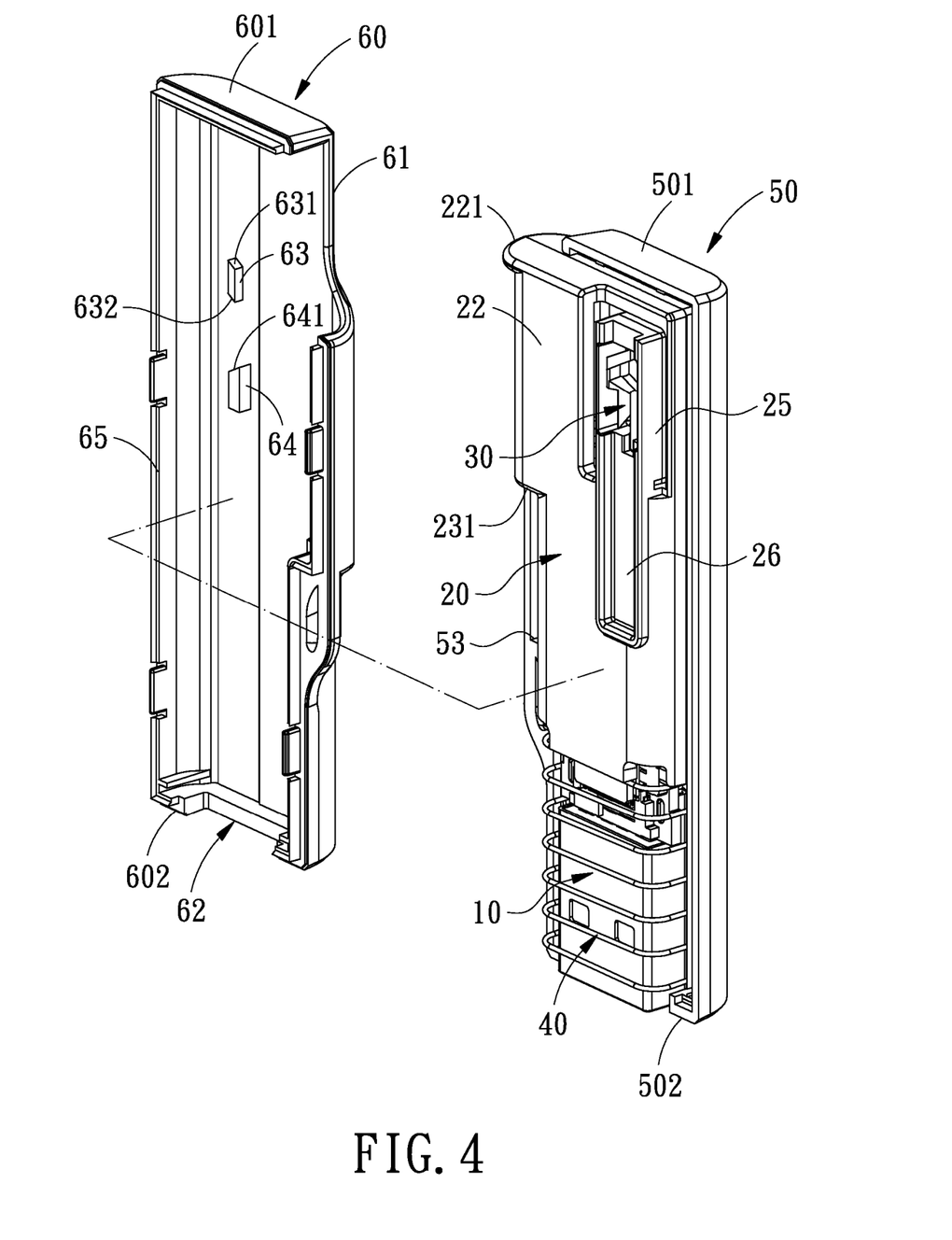
FIG. 4 is a partial perspective view of the memory device in accordance with the present invention.
Figure 5:
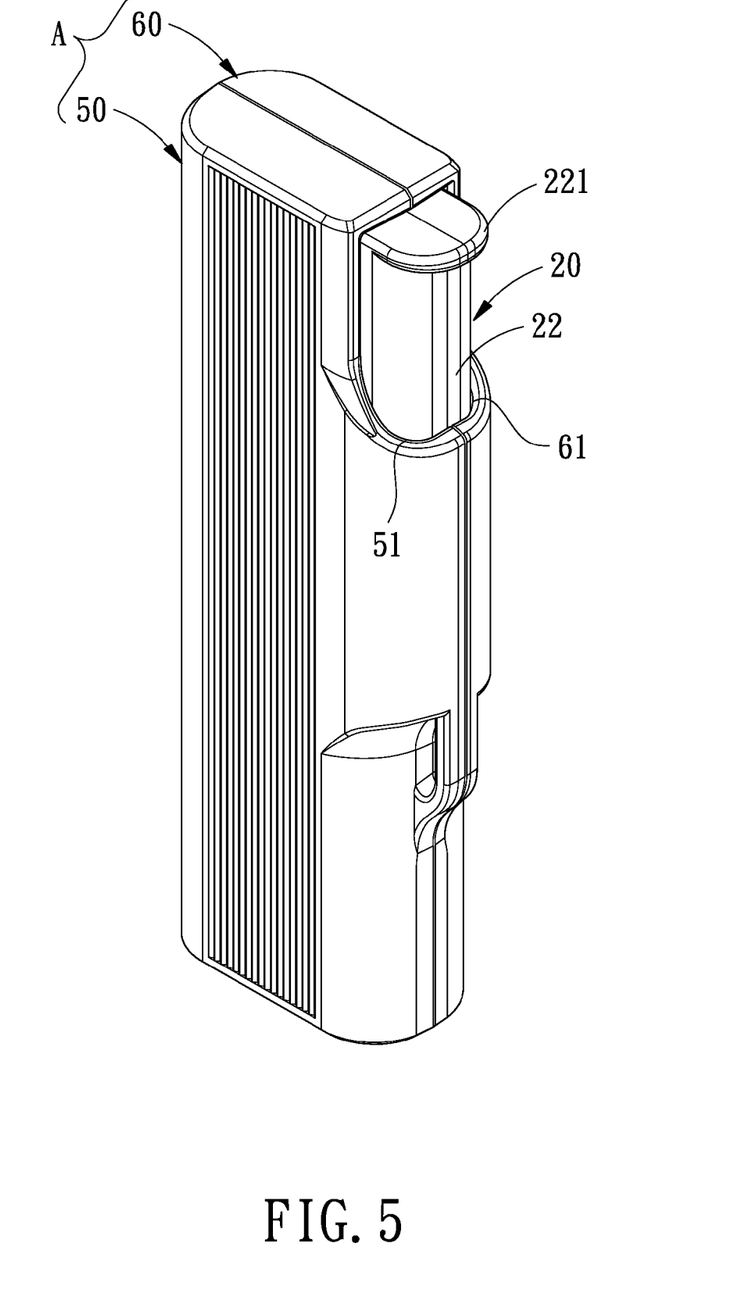
FIG. 5 is a perspective view showing the connecting terminal retracts into the shell in accordance with the present invention.

The shell A is a hollow structure formed by oppositely combining the first cover 50 and the second cover 60 for accommodation of the main body 10, the drive element 20, the positioning element 30 and the spring 40. As shown in FIGS. 1, 4 and 5, the first cover 50 and the second cover 60 are hollow structures shaped correspondingly to the drive element 20 and the main body 10. Each of the first and the second covers 50, 60 is formed with a closed end 501, 601 and an open end 502, 602 in the direction Y. In each of the first and the second covers 50, 60 is formed with a breach 51, 61 which is located adjacent to the closed end 501, 601 correspondingly to the pushing portion 22 of the drive element 20. The open end 502, 602 of each of the first and the second covers 50, 60 is formed with a notch 52, 62 in an end surface thereof. When the first cover 50 and the second cover 60 are combined, the two breaches 51, 61 will be oppositely combined to define a slot through which the pushing portion 22 of the drive element 20 is exposed and the resisting flange 221 protrudes out of the shell A. The two notches 52, 62 are oppositely combined to define an opening for insertion of the connecting terminal 11.

As shown in FIG. 1, the first cover 50 is formed on an inner surface thereof with a stopping plate 53 correspondingly to the resisting surface 231 of the pushing portion 22 of the drive element 20, and the stopping plate 53 cooperates with the resisting surface 231 of the pushing portion 22 of the drive element 20 to define a space for limiting sliding of the pushing portion 22 of the drive element 20 the closed ends 501, 601 and the stopping plate 53. As shown in FIG. 4, the second cover 60 is formed on an inner surface thereof with a positioning block 63 and a limiting block 64 correspondingly to the recess 251 and the elongated groove 26 of the drive element 20. The positioning block 63 is located adjacent to the closed end 601 and the closed end 201 of the drive element 20, and the limiting block 64 is located adjacent to the open end 602 and the open end 202 of the drive element 20. When the drive element 20 is pushed, the positioning block 63 and the limiting block 64 will move along the elongated groove 26 and the recess 251. The positioning block 63 is in thickness smaller than the limiting block 64. The positioning block 63 is formed on both ends thereof in the direction Y with a top surface 631 and a bottom surface 632 extending along a helical direction of the clockwise guiding surface 327 of the positioning element 30. The limiting block 64 is obliquely formed with a guide surface 641 which is located adjacent to the bottom surface 632 along a helical direction of the counterclockwise guiding surface 328 of the positioning element 30. Furthermore, the first cover 50 is formed with a positioning groove 55 in a peripheral edge thereof, and the second cover 60 is formed with a positioning rib 65 on a peripheral edge thereof. After the positioning rib 65 is engaged into the positioning groove 55, the first and the second covers 50, 60 will be adhered together to form the memory device in accordance with the present invention by ultra-sound wave.

Figure 6:
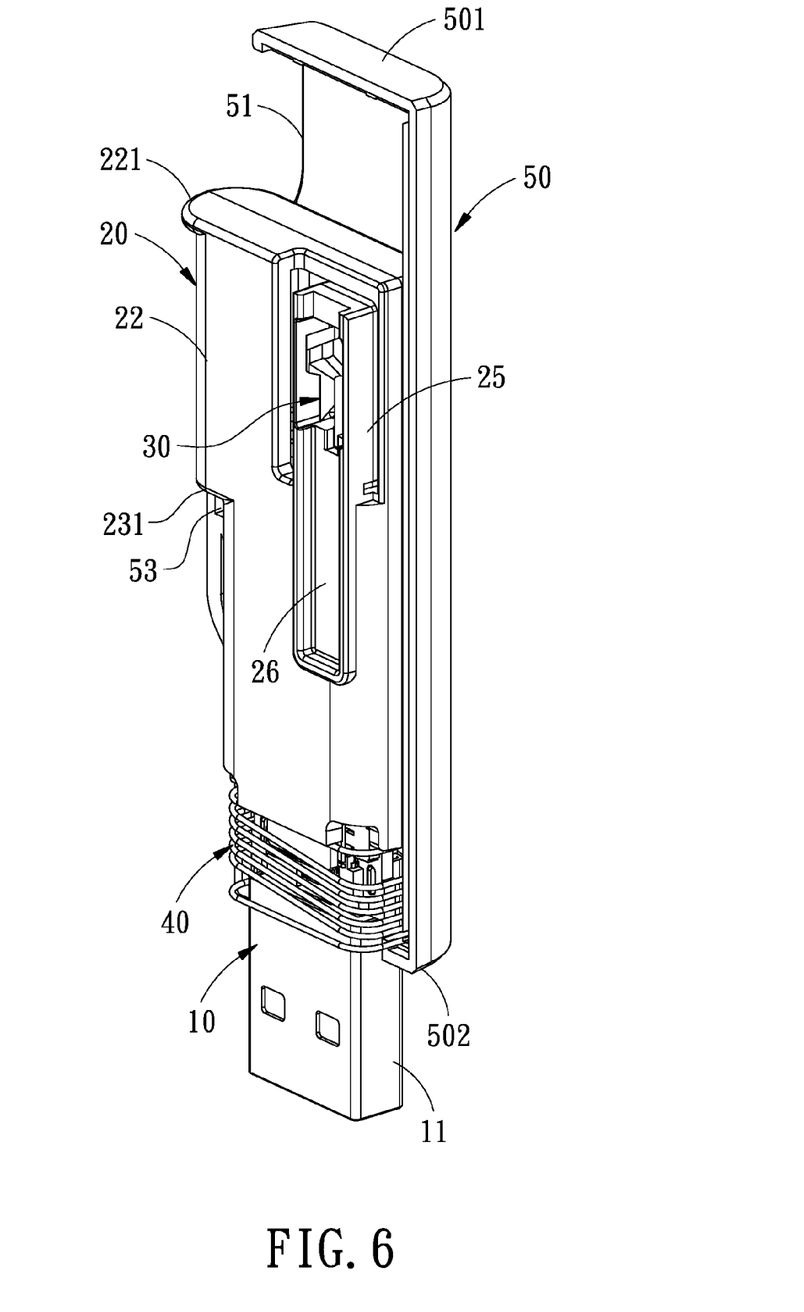
FIG. 6 shows that the connecting terminal extends out of the shell in accordance with the present invention.

Thereby, as shown in FIGS. 4 and 6, the spring 40 has two ends pushed against an edge of the open end 202 of the drive element 20 and a peripheral edge of the opening of the shell A, respectively. When the drive element 20 is forced to compress the spring 40 through the pushing portion 22, the drive element 20 will drive the main body 10 and the positioning element 30 to slide in the shell A. Through the deformation of the elastic portion 25, and the cooperation of the multiple cutting surfaces of the engaging portions 32 with the positioning block 63 and the limiting block 64, the positioning element 30 can slide and pivot so as to make the connecting terminal 11 extend out of or retract into the shell A.

Furthermore, the first cover 50 is formed with a display hole 54. When the connecting terminal 11 is inserted into a connecting port of a computer and electrified, an indicator light (not shown) in the main body 10 will emit light, making it possible to check whether the portable memory device in accordance with the present invention is electrified through the display hole 54.

The aforementioned is the summary of the positional and structural relationship of the respective components of the preferred embodiment in accordance with the present invention.

To assemble the extension positioning structure of the portable memory device in accordance with the present invention, the main body 10 and the drive element 20 are combined first, and then the positioning element 30 is pivotally engaged in the recess 251 of the drive element 20 with the engaging portion 32 facing the opening of the recess 251, subsequently, the spring 40 will be mounted outside the connecting terminal 11, and finally, the first cover 50 and the second cover 60 will cover the above combined structure to form the shell A in such a manner that the pushing portion 22 of the drive element 20 is exposed from the slot of the shell A, and the spring 40 abuts against the drive element 20 and the peripheral edge of the opening of the shell A in a uncompressed manner. Since the drive element 20 is made of plastic material, the elastic portion 25 can return to its original state after deformation Therefore, when the drive element 20 is pushed, the positioning element 30 will slide and pivot through cooperation of the multiple cutting surfaces of the engaging portion 32 of the positioning element 30 with the positioning block 63 and the limiting block 64 of the second cover 60. Through the deformation of the elastic portion 25, an elastic space will be offered for the positioning element 30 to evade the positioning block 63, realizing two operation modes: the connecting terminal 11 of the memory device to extend out of or retract into the shell A.

Figure 8A:
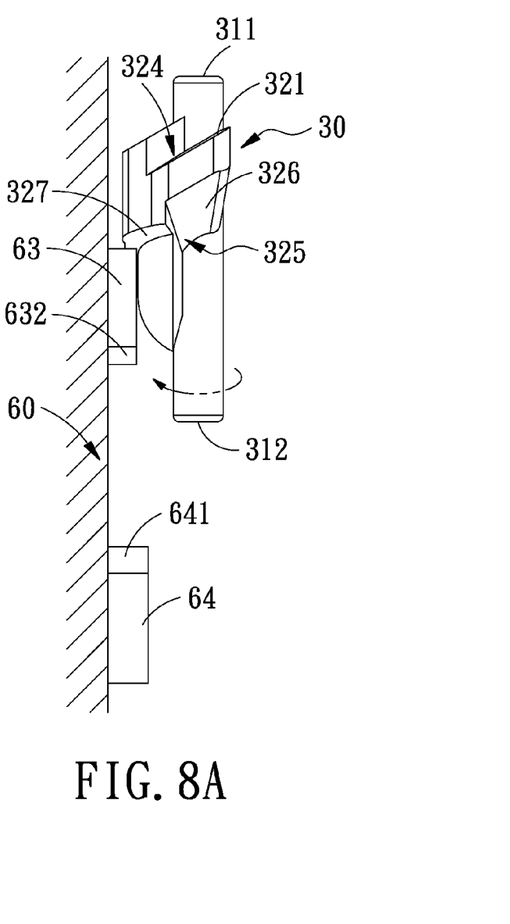
FIG. 8A is a side view showing a second structural configuration of the positioning block, the limiting block and the positioning block in the direction X.
Figure 8B:
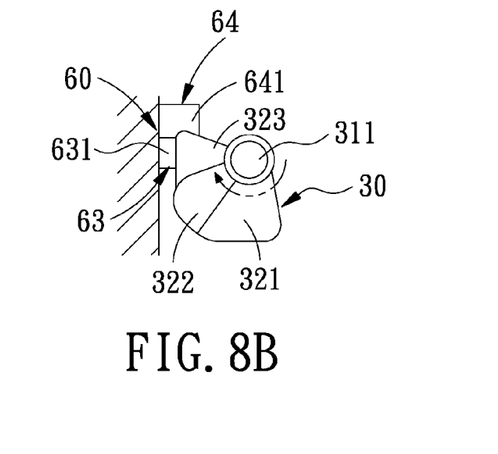
FIG. 8B is a side view showing the second structural configuration of the positioning block, the limiting block and the positioning block in the direction Y.
Figure 8C:
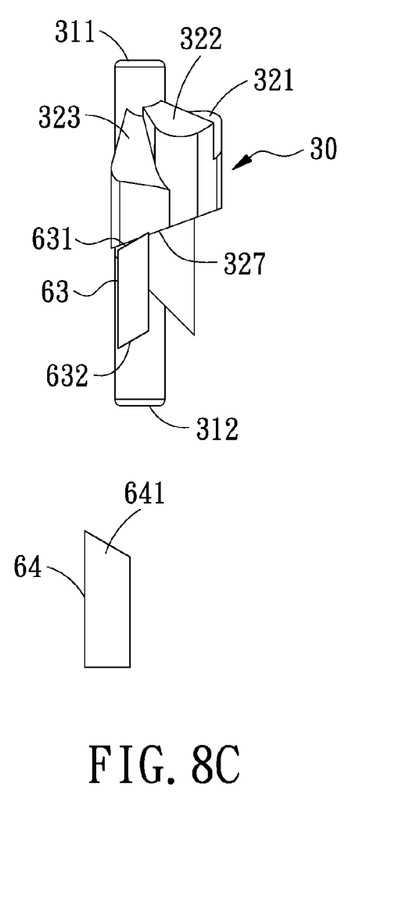
FIG. 8C is a side view showing the second structural configuration of the positioning block, the limiting block and the positioning block in the direction Z.
Figure 9A:
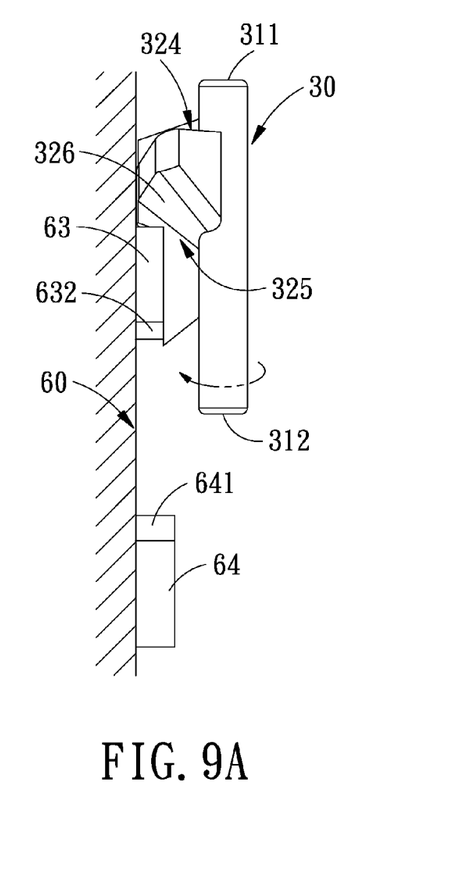
FIG. 9A is a side view showing a third structural configuration of the positioning block, the limiting block and the positioning block in the direction X.
Figure 9B:
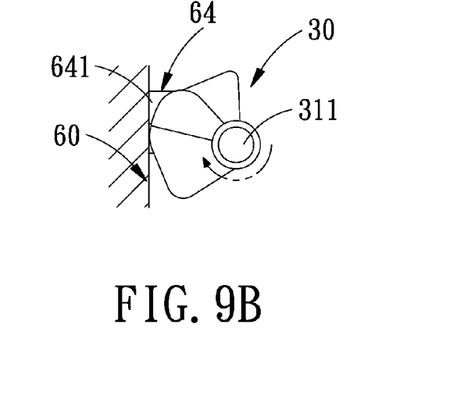
FIG. 9B is a side view showing the third structural configuration of the positioning block, the limiting block and the positioning block in the direction Y.
Figure 9C:
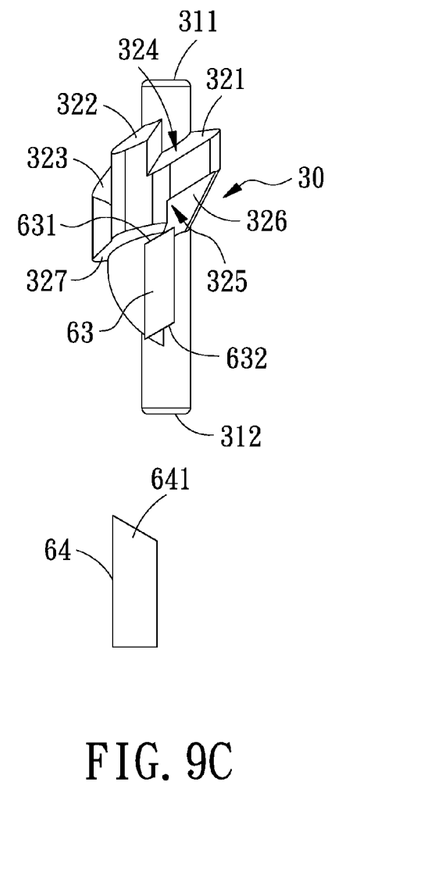
FIG. 9C is a side view showing the third structural configuration of the positioning block, the limiting block and the positioning block in the direction Z.
Figure 10A:
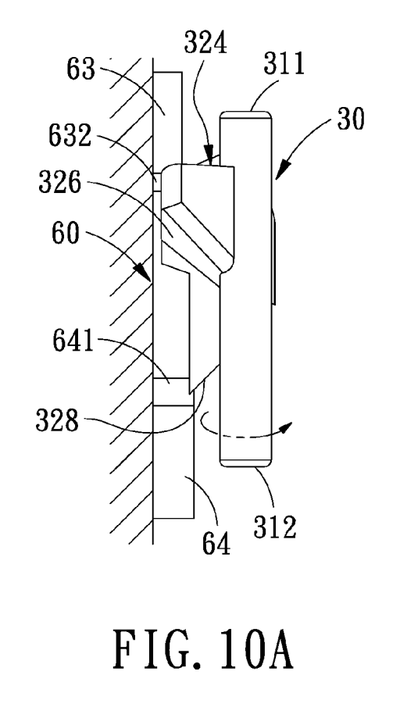
FIG. 10A is a side view showing a fourth structural configuration of the positioning block, the limiting block and the positioning block in the direction X.
Figure 10B:
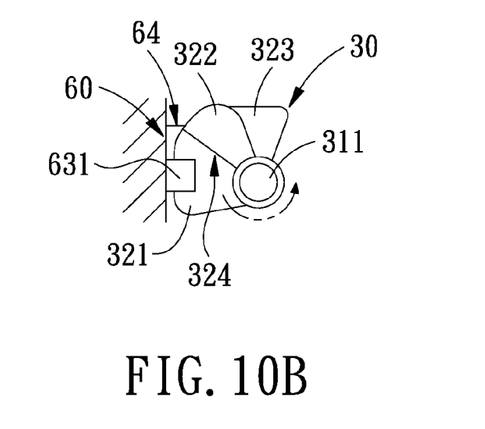
FIG. 10B is a side view showing the fourth structural configuration of the positioning block, the limiting block and the positioning block in the direction Y.
Figure 10C:
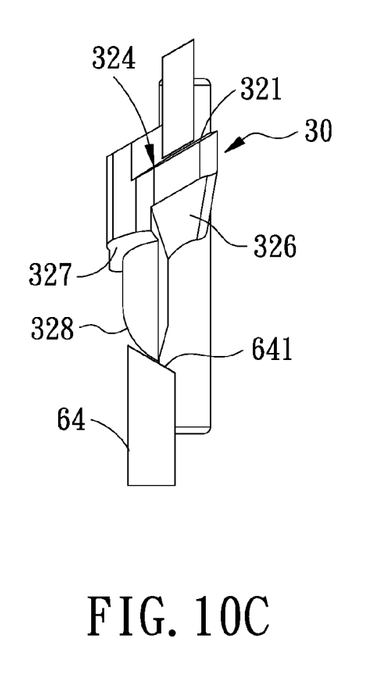
FIG. 10C is a side view showing the fourth structural configuration of the positioning block, the limiting block and the positioning block in the direction Z.

Referring to FIGS. 7A to 10C, the following description is directed to four structural configurations showing how the positioning element 30 moves by cooperating with the positioning block 63 and the limiting block 64, and the fours structural configurations are viewed from the direction Y as shown in FIGS. 7A, 8A, 9A and 10A, the direction X as shown in FIGS. 7B, 8B, 9B and 10B, a direction Z vertical to the X direction and the direction Y as shown in FIGS. 8C, 9C and 10C, respectively.

Firstly, as shown in FIGS. 7A, 7B and 7C showing a structural configuration before starting moving, showing the connecting terminal 11 retracts into the shell A, the positioning block 63 and the limiting block 64 are disposed in the elongated groove 26, and the positioning element 30 is located away from the positioning block 63 and the limiting block 64, and the clockwise guiding surface 327 is located above the top surface 631 of the positioning block 63. When a force is applied to push the pushing portion 22 of the drive element 20, the positioning element 30 will nonrotatably move toward the positioning block 63, finally presenting a second structural configuration as shown in FIGS. 8A, 8B and 8C.

As shown in FIGS. 8A, 8B and 8C, the clockwise guiding surface 327 is located adjacent to the second end 312 of the positioning element 30 and abuts against the top surface 631 of the positioning block 63. When the drive element 20 is continuously pushed, the clockwise guiding surface 327 will cooperate with the top surface 631 of the positioning block 63, as shown in FIG. 8B, so as to make the positioning element 30 pivot in the recess 251 in the clockwise direction, presenting a third structural configuration as shown in FIGS. 9A, 9B and 9C.

As shown in FIGS. 9A, 9B and 9C, the top surface 631 of the positioning block 63 is located at a connecting position of the clockwise guiding surface 327 and the notch 325. When the drive element 20 is continuously pushed, as shown in FIG. 9C, the positioning element 30 will continuously pivot in the clockwise direction, forcing the positioning block 63 to fall into the notch 325 with the top surface 631 pushing against the pressing surface 326. At this moment, the positioning element 30 arrives at the pivoting limit in the clockwise direction. When the drive element 20 is forced again, as shown in FIGS. 9A and 9B, the pressing surface 326 is made to slide along the oblique direction of the top surface 631 of the positioning block 63. Meanwhile, the positioning block 63 presses the positioning element 30 to make the elastic portion 25 deform toward the interior of the accommodation space 21 of the drive element 20, synchronously forming the elastic space for the engaging portion 32 to evade the positioning block 63.

After the positioning block 63 gets across the engaging portion 32, the user will stop pushing the drive element 20. The drive element 20 will move in an opposite direction under the action of a restoration force of the compressed spring 40, presenting a fourth structural configuration as shown in FIGS. 10A, 10B and 10C, showing that the positioning block 63 falls into the gap 324 upon stopping pushing the drive element 20, finishing the operation of extending and positioning the connecting terminal 11 out of the shell A for use.

Referring to FIG. 10C, to make the connecting terminal 11 retract into the shell A, the drive element 20 will be pressed to compress the spring 40, so that the counterclockwise surface 328 of the positioning element 30 can be brought into contact with the guide surface 641 of the limiting block 64, making the positioning element 30 slide relative to the guide surface 641 of the limiting block 64 through the counterclockwise guiding surface 328 and pivot in the counterclockwise direction. When the spring 40 is completely compressed, the positioning block 63 will disengage from the gap 324 and get across the guiding surface 322. Upon stopping pressing the drive element 20, the drive element 20 will be pushed to return to the first operating state by the restoration force of the spring 40. At the same moment, the positioning element 30 will be brought into contact with the oblique surface 323 first and then evade the positioning block 63 through the elastic space provided by the elastic portion 25 and finally returns to the first operating state after the positioning block 63 gets across the engaging portion 32.

By such arrangements, due to mutual cooperation of the simple elements, the extension positioning structure for the memory device in accordance with the present invention has the advantages of easy to operate, reduced production cost and increased yield rate.

While we have shown and described various embodiments in accordance with the present invention, it is clear to those skilled in the art that further embodiments may be made without departing from the scope of the present invention.

What is claimed is:

1. An extension positioning structure for a portable memory device comprising:
    a main body including a connecting terminal, a memory unit and a connecting portion connecting the connecting terminal and the memory unit, an extending direction of the connecting terminal and the memory unit being defined as a direction Y;
    a drive element being a U-shaped groove formed with an accommodation space, the accommodation space being formed with a closed end and an open end in the direction Y, at one Y directional side of the accommodation space being provided a pushing portion which protrudes outwards, at another Y directional side of the accommodation space being formed a U-shaped groove which penetrating a bottom surface of the accommodation space, on the bottom surface of the accommodation space being formed an elastic portion surrounded by the U-shaped groove, the elastic portion being formed with a recess from an exterior of the drive element toward an interior of the accommodation space, a portion of the recess which is located adjacent to the open end of the accommodation space being in communication with an elongated groove, the memory unit of the main body being disposed in the accommodation space;
    a positioning element including a pivot shaft and an engaging portion, the pivot shaft including a first end and a second end, the engaging portion being in the form of a block body including multiple cutting surfaces and protruding from one side of the pivot shaft, the positioning element being pivotally disposed in the recess of the drive element such that the engaging portion protrudes toward an opening of the recess of the drive element, the engaging portion being cut from the first end of the pivot shaft toward the second end of the pivot shaft to form a cutting surface, a guiding surface and an oblique surface that are located adjacent to a peripheral surface of the pivot shaft, the guiding surface being formed between the cutting surface and the oblique surface and higher than the cutting surface and the oblique surface, the guiding surface and the oblique surface being cut from the peripheral surface of the pivot shaft toward the second end of the pivot shaft, the cutting surface being from the a side surface of the engaging portion toward the second end of the pivot shaft along the peripheral surface of the pivot shaft, such that a height difference being between the guiding surface and the cutting surface to form a gap, the engaging portion being formed adjacent to the second end of the pivot shaft with a notch opposite the gap, under the guiding surface and the oblique surface being helically formed a clockwise guiding surface which is parallel to a helical direction of the cutting surface, from the clockwise guiding surface being extended a counterclockwise guiding surface;

a spring being a coil spring and mounted outside the connecting terminal;

a shell being a hollow structure formed by oppositely combining two covers for accommodation of the main body, the drive element and the spring, the positioning element being pivotally disposed between one of the two covers and the drive element, the shell being formed with a slot through which the pushing portion of the drive element is exposed out of the shell, the shell being formed with an opening through which the connecting terminal extends out of the shell, the one of the covers being formed with a positioning block and a limiting block correspondingly to the recess and the elongated groove of the drive element, the positioning block being located adjacent to the closed end of the drive element, and limiting block being located adjacent to the open end of the drive element, a thickness of the positioning block being smaller than that of the limiting block, the positioning block being formed on both ends thereof in the direction Y with a top surface and a bottom surface extending along a helical direction of the clockwise guiding surface of the positioning element, the limiting block being obliquely formed with a guide surface which is located adjacent to the bottom surface along a helical direction of the counterclockwise guiding surface of the positioning element;

thereby, the spring has two ends pushed against an edge of the open end of the drive element and a peripheral edge of the opening of the shell, respectively, the drive element drives the main body and the positioning element to slide in the shell, when the drive element compresses the spring and makes the connecting terminal extend out of the shell, the positioning block of the shell will be engaged in the gap of the positioning element, when the spring pushes against the drive element and makes the connecting terminal retract into the shell, the positioning block of the shell will disengage from the engaging portion of the positioning block.

2. The extension positioning structure for a portable memory device as claimed in claim 1, wherein a notch is formed in each of two Y directional sides of the connecting portion, at each of two Y directional inner sides of the accommodation space of the drive element is formed a positioning cylinder located adjacent to the open end of the accommodation space, such that the two positioning cylinders are inserted in the respective notches, thus positioning the drive element with respect to the main body.

3. The extension positioning structure for a portable memory device as claimed in claim 1, wherein the drive element is further formed adjacent to the open end of the accommodation space with a breach and a resisting surface that are in alignment with the pushing portion, and the shell is formed on an inner surface thereof with a stopping plate correspondingly to the resisting surface of the pushing portion of the drive element, the stopping plate cooperates with the resisting surface of the pushing portion of the drive element to define a space for limiting sliding of the pushing portion of the drive element between an end of the shell and the stopping plate of the shell.

4. The extension positioning structure for a portable memory device as claimed in claim 1, wherein the elongated groove is a long shallow groove formed in the direction Y, when the drive element is pushed, the positioning block and the limiting block of the shell will slide along the elongated groove.

5. The extension positioning structure for a portable memory device as claimed in claim 1, wherein the recess of the elastic portion is formed with an engaging groove in a bottom surface thereof adjacent to the closed end, and a holding groove adjacent to the open end, the first end of the positioning is engaged in the engaging groove of the drive element, and the second end of the positioning element is disposed in the holding groove, such that the positioning element is pivotally disposed in the recess of the drive element.

6. The extension positioning structure for a portable memory device as claimed in claim 1, wherein the two covers are a first cover and a second cover, the first cover and the second cover are hollow structures shaped correspondingly to the drive element and the main body, each of the first and the second covers is formed with a closed end and an open end, each of the first and the second covers is formed with a breach adjacent to the closed end thereof correspondingly to the pushing portion of the drive element, the open end of each of the first and the second covers is formed with a notch in an end surface thereof, when the first cover and the second cover are combined, the two breaches of the two covers will be oppositely combined to define the cut through which the pushing portion of the drive element extends out of the shell, the two notches are oppositely combined to define the opening for insertion of the connecting terminal.

7. The extension positioning structure for a portable memory device as claimed in claim 6, wherein the first cover is further formed with a display hole.

8. The extension positioning structure for a portable memory device as claimed in claim 6, wherein the first cover is formed with a positioning groove in a peripheral edge thereof, and the second cover is formed with a positioning rib on a peripheral edge thereof, the first cover and the second cover are combined together by inserting the positioning rib into the positioning groove.

* * * * *